United States Patent [19]
Shih et al.

[11] Patent Number: 5,846,860
[45] Date of Patent: Dec. 8, 1998

[54] METHOD OF MAKING BURIED CONTACT IN DRAM TECHNOLOGY

[75] Inventors: Chun-Yi Shih; Julie Huang; Mong-Song Liang, all of Hsin-Chu, Taiwan

[73] Assignee: Taiwan Semiconductor Manufacturing Company, Ltd., Hsin-Chu, Taiwan

[21] Appl. No.: 668,801

[22] Filed: Jun. 24, 1996

[51] Int. Cl.⁶ ............................................... H01L 21/8242
[52] U.S. Cl. ..................... 438/253; 438/251; 438/666; 438/564; 148/DIG. 20
[58] Field of Search .................................... 438/250–256, 438/396–398, 618, 620, 621, 666, 947, 564; 148/DIG. 20

[56] References Cited

U.S. PATENT DOCUMENTS

| 5,198,386 | 3/1993 | Gonzalez . | |
| 5,350,712 | 9/1994 | Shibata | 437/195 |
| 5,491,104 | 2/1996 | Lee et al. . | |
| 5,494,848 | 2/1996 | Chin | 437/191 |
| 5,525,552 | 6/1996 | Huang | 437/41 |

OTHER PUBLICATIONS

S. Wolf, "Silicon Processing for the VLSI Era–vol. 2" Lattice Press, Sunset Beach, CA, pp. 160–162, 1990.

*Primary Examiner*—Jey Tsai
*Attorney, Agent, or Firm*—George O. Saile; Stephen B. Ackerman; Rosemary L. S. Pike

[57] ABSTRACT

A new method of forming an improved buried contact junction is described. Word lines are provided over the surface of a semiconductor substrate. A first insulating layer is deposited overlying the word lines. The first insulating layer is etched away where it is not covered by a buried contact mask to provide an opening to the semiconductor substrate. A layer of tetraethoxysilane (TEOS) silicon oxide is deposited over the first insulating layer and over the semiconductor substrate within the opening. The TEOS layer is anisotropically etched to leave spacers on the sidewalls of the word lines and of the first insulating layer. A first layer of polysilicon is deposited overlying the first insulating layer and within the opening. The first polysilicon layer is doped with dopant which is driven in to form a buried contact junction within the semiconductor substrate under the opening. The first polysilicon layer is patterned to form a polysilicon contact overlying the buried contact junction wherein the mask used for the patterning is misaligned and wherein a portion of a TEOS spacer overlying the buried contact junction is exposed and wherein a portion of the first polysilicon layer other than that of the contact remains as residue. The first polysilicon layer residue is etched away wherein the exposed TEOS spacer protects the buried contact junction within the semiconductor substrate from the etching completing the formation of a buried contact in the fabrication of an integrated circuit.

24 Claims, 11 Drawing Sheets

METHOD OF MAKING BURIED CONTACT IN DRAM TECHNOLOGY

BACKGROUND OF THE INVENTION (1) Field of the Invention

The invention relates to the fabrication of integrated circuit devices, and more particularly, to a method of an improved buried contact without a trench in the fabrication of integrated circuits.

(2) Description of the Prior Art

A typical buried contact is formed by depositing a doped layer of polysilicon over and on the planned buried contact regions and heating the structure. The buried contact regions are doped by outdiffusion of dopants from the doped polysilicon layer into the silicon substrate. The doped polysilicon layer is allowed to remain on the buried contact regions as their contacts. Large lateral diffusion of the buried contact junction causes field leakage and results in a shorter refresh time cycle. If there is misalignment of the mask during etching of the polysilicon, a portion of the semiconductor substrate within the buried contact area will be exposed. During polysilicon overetching, a buried contact trench will be etched. This also affects refresh cycle time.

*Silicon Processing for the VLSI Era,* Vol. 2 by Stanley Wolf, Lattice Press, Sunset Beach, Calif., c. 1990, pp. 160–162 describes the use of buried contacts and local interconnections. U.S. Pat. No. 5,350,712 to Shibata teaches the use of an additional metal width around a metal line to overcome mask misalignment problems causing etching of the semiconductor substrate. U.S. Pat. No. 5,525,552 to J. M. Huang teaches the use of a low dielectric constant spacer to provide better immunity of the buried contact trench. Copending U.S. patent application Ser. No. 08/503,173 (TSMC94-084) to J. M. Huang filed on Jul. 17, 1995 teaches linking the buried contact junction and the source junction by an extra high dosage N+ implant to overcome the disadvantages of a buried contact trench. U.S. Pat. No. 5,494,848 to H. W. Chin teaches the use of a reverse tone oversized buried contact mask to prevent formation of a buried contact trench. Co-pending U.S. patent application Ser. No. 08/621,273 (TSMC95-177) to M. S. Liang et al filed on Mar. 25, 1996 teaches the use of protective TEOS sidewall spacers in SRAM technology.

SUMMARY OF THE INVENTION

A principal object of the present invention is to provide an effective and very manufacturable method of forming buried contact junctions.

Another object of the present invention is to provide a method of forming buried contact junctions which avoid the formation of a trench caused by mask misalignment.

Yet another object is to reduce the effective buried contact opening and to minimize lateral diffusion of the buried contact in the fabrication of an integrated circuit.

In accordance with the objects of this invention a new method of forming an improved buried contact junction is achieved. Word lines are provided over the surface of a semiconductor substrate. A first insulating layer is deposited overlying the word lines. The first insulating layer is etched away where it is not covered by a buried contact mask to provide an opening to the semiconductor substrate. A layer of tetraethoxysilane (TEOS) is deposited over the first insulating layer and over the semiconductor substrate within the opening. The TEOS layer is anisotropically etched to leave TEOS spacers on the sidewalls of the word lines and on the sidewalls of the first insulating layer. A first layer of polysilicon is deposited overlying the first insulating layer and over the substrate within the opening. The first polysilicon layer is doped with dopant which is driven in to form a buried contact junction within the semiconductor substrate under the opening. The first polysilicon layer is patterned to form a polysilicon contact overlying the buried contact junction wherein the mask used for the patterning is misaligned and wherein a portion of a TEOS spacer overlying the buried contact junction is exposed and wherein a portion of the first polysilicon layer other than that of the contact remains as residue. The first polysilicon layer residue is etched away wherein the exposed TEOS spacer protects the buried contact junction within the semiconductor substrate from the etching completing the formation of a buried contact in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1A:
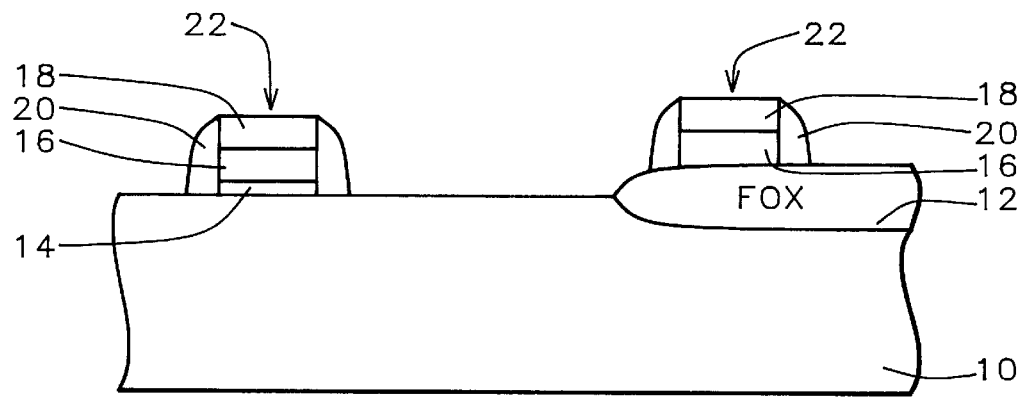
FIGS. 1A, 2A, 3A, 4A, 5A, 6A, 7A, 8A, 9A schematically illustrate in cross-sectional representation a preferred embodiment of the present invention with reference to view A—A of FIG. 10.
Figure 1B:
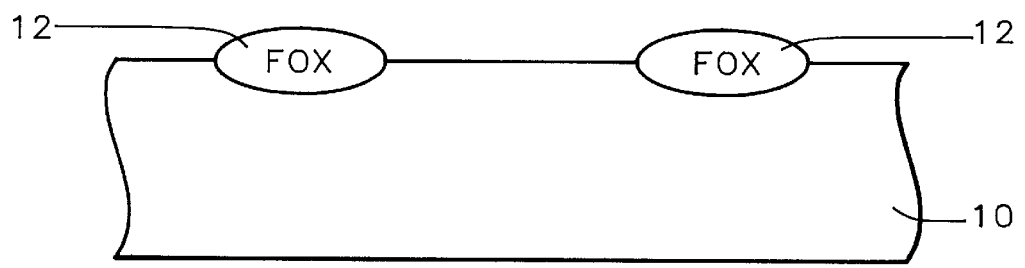
FIGS. 1B, 2B, 3B, 4B, 5B, 6B, 7B, 8B, 9B schematically illustrate in cross-sectional representation a preferred embodiment of the present invention with reference to view B—B of FIG. 10.

Referring now more particularly to FIGS. 1A and 1B, there is shown a portion of a partially completed integrated circuit. There is shown a monocrystalline semiconductor substrate 10 in which there are formed field oxide regions 12. Word lines are formed as is conventional in the art and as illustrated in FIG. 1A. Word lines 22 comprise a polysilicon layer 16 overlying insulating layer 14 or field oxide layer 12, P1-TEOS layer 18, composed of tetraethoxysilane (TEOS) silicon oxide overlying the polysilicon layer 16, and spacers 20 composed of TEOS silicon oxide.

Figure 2A:
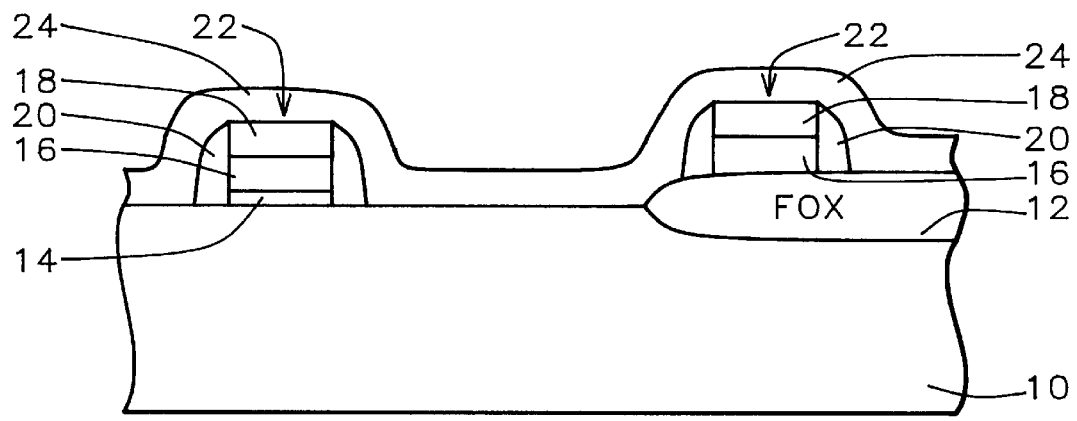
Figure 2B:
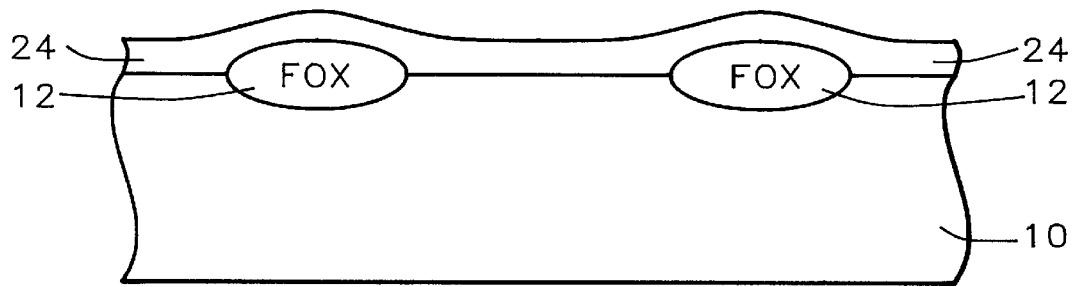

Referring now to FIGS. 2A and 2B, a layer of TEOS silicon oxide 24 is deposited over the pattern of word lines to a thickness of between about 1000 to 2000 Angstroms. This layer provides dielectric isolation. The layer 24 may be composed of some other material, such as high temperature oxide, borophosphosilicate glass (BPSG), or the like.

Figure 3A:
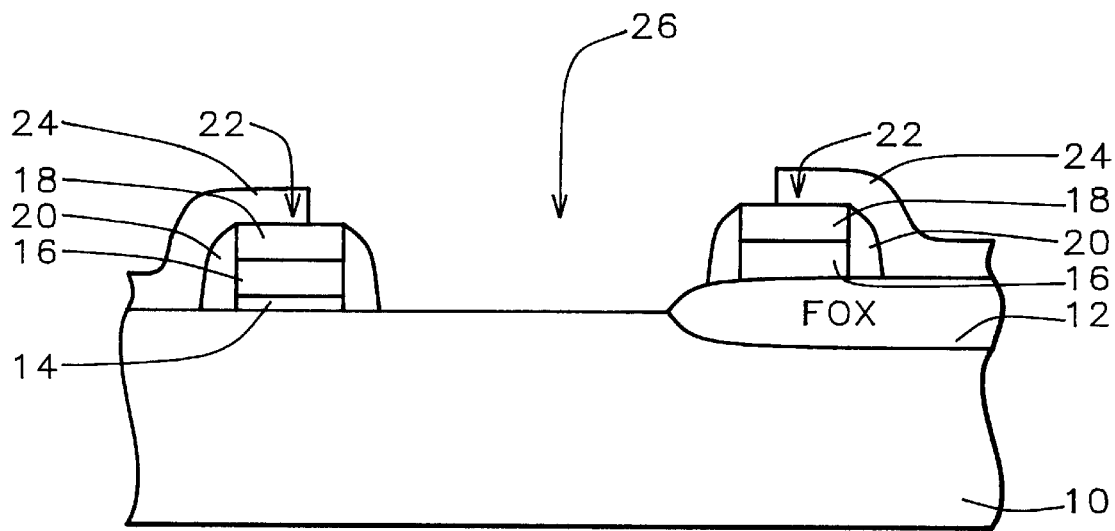
Figure 3B:
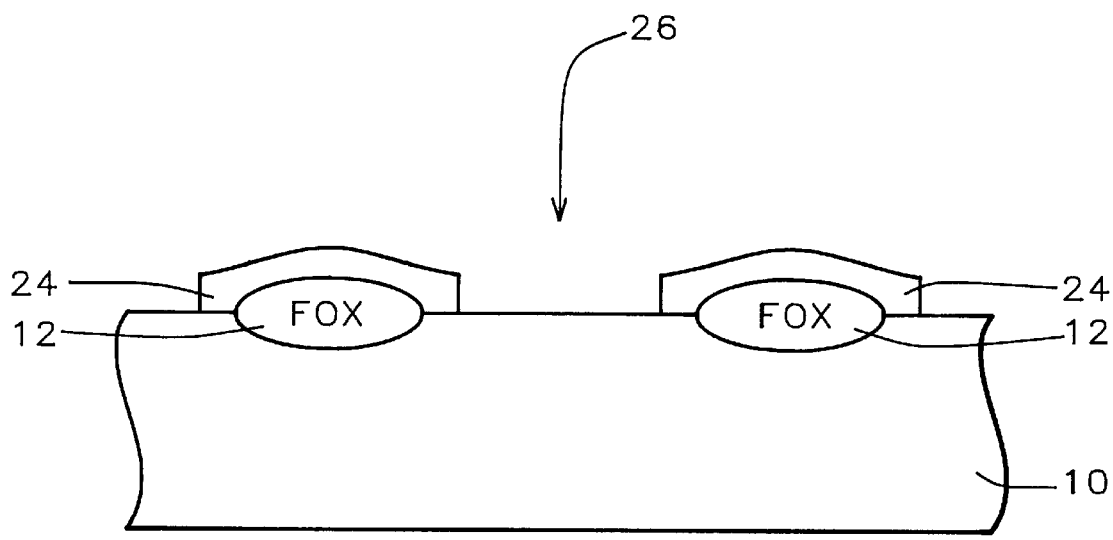

The TEOS silicon oxide layer 24 is etched away where it is not covered by a mask to form the buried contact opening 26, shown in FIGS. 3A and 3B.

Figure 4A:
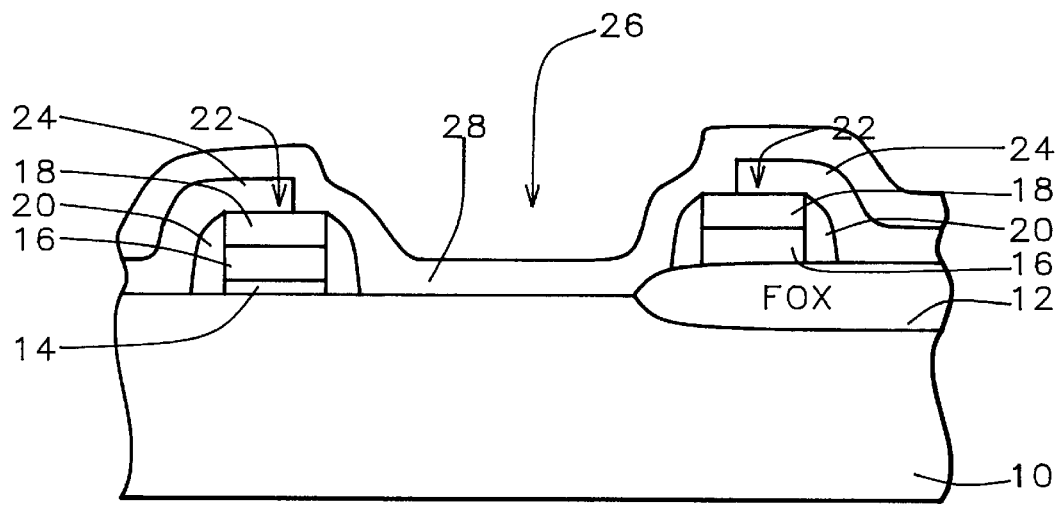
Figure 4B:
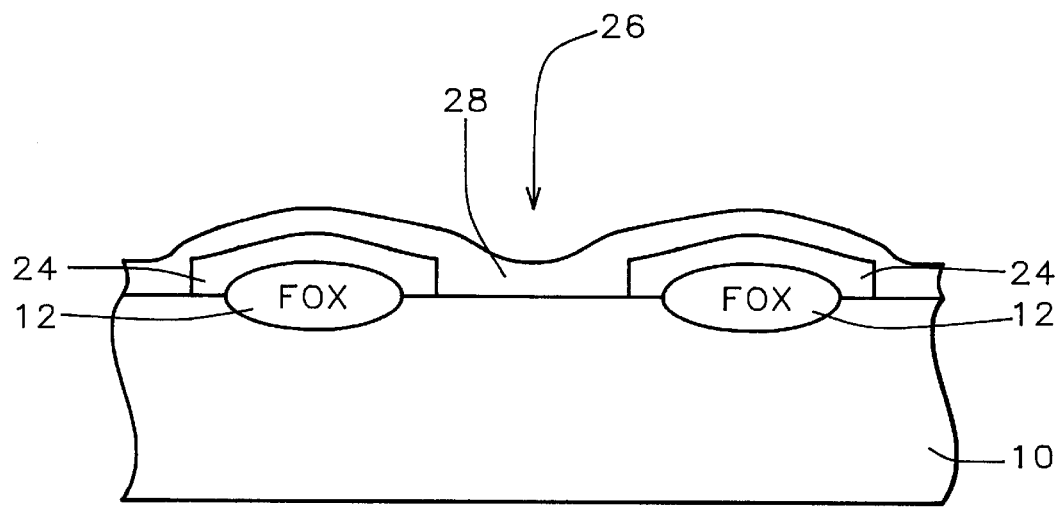

Now, the key protective spacers of the present invention will be formed by the following steps. A layer of TEOS silicon oxide 28 is deposited over the surface of the semiconductor substrate and within the buried contact opening 26, as illustrated in FIGS. 4A and 4B, to a depth of between about 1000 to 2000 Angstroms. This layer may be composed of some other material such as silicon nitride. The TEOS layer 28 is anisotropically etched to leave spacers 30 on the sidewalls of the word lines 22 and spacers 32 on the sidewalls of the TEOS layer 24, as shown in FIGS. 5A and 5B.

Figure 5A:
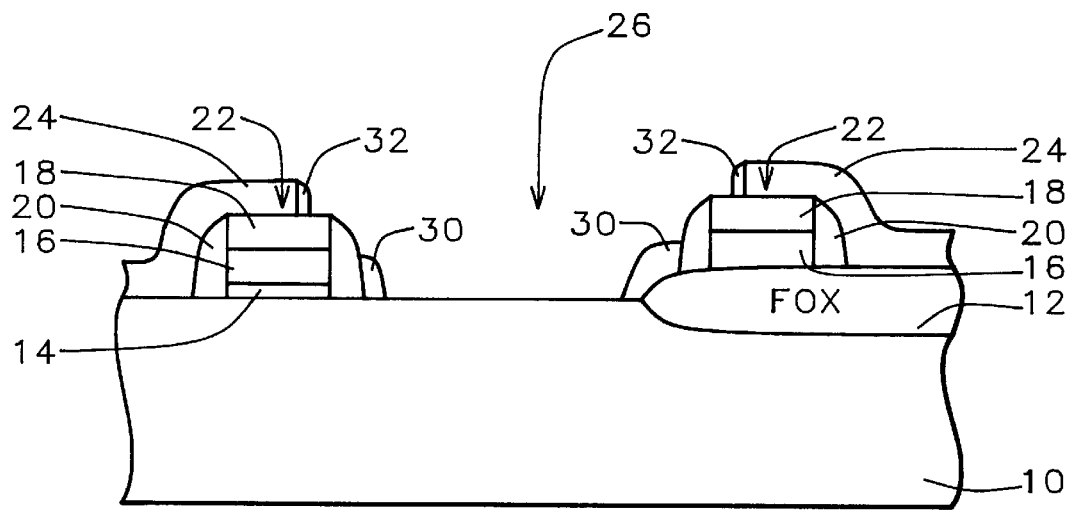
Figure 5B:
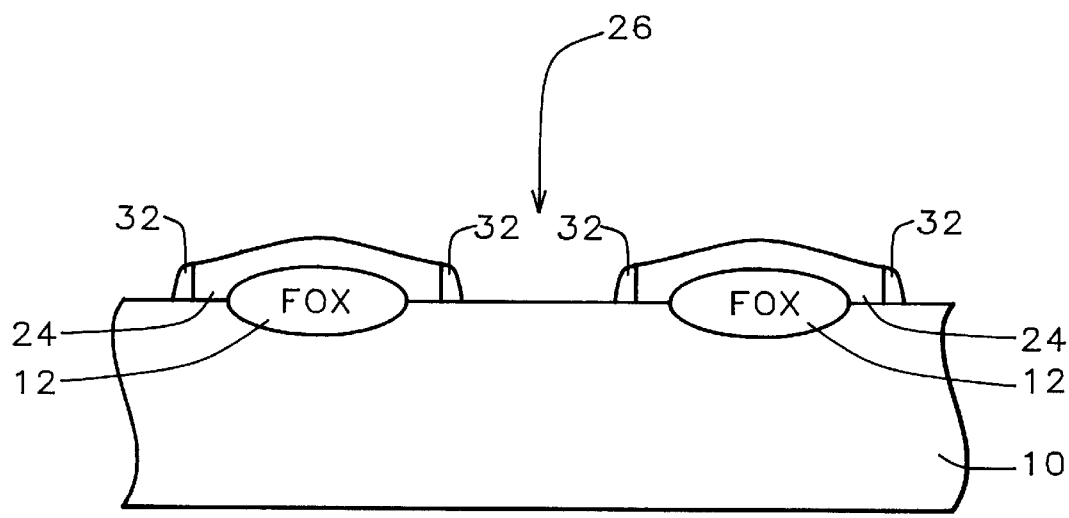

The spacers 30 on the sidewalls of the word lines reduce the effective buried contact opening 26, as illustrated in FIG. 5A. This will minimize lateral diffusion of the buried contact. In FIG. 5B, it can be seen that the spacers 32 on the sidewalls of the TEOS silicon oxide layer 24 reduce the effective buried contact opening 26. This will minimize lateral diffusion of the buried contact and will also avoid a possible silicon trench due to non-overlap of the capacitor electrode and the buried contact, as will be discussed hereinafter.

Figure 6A:
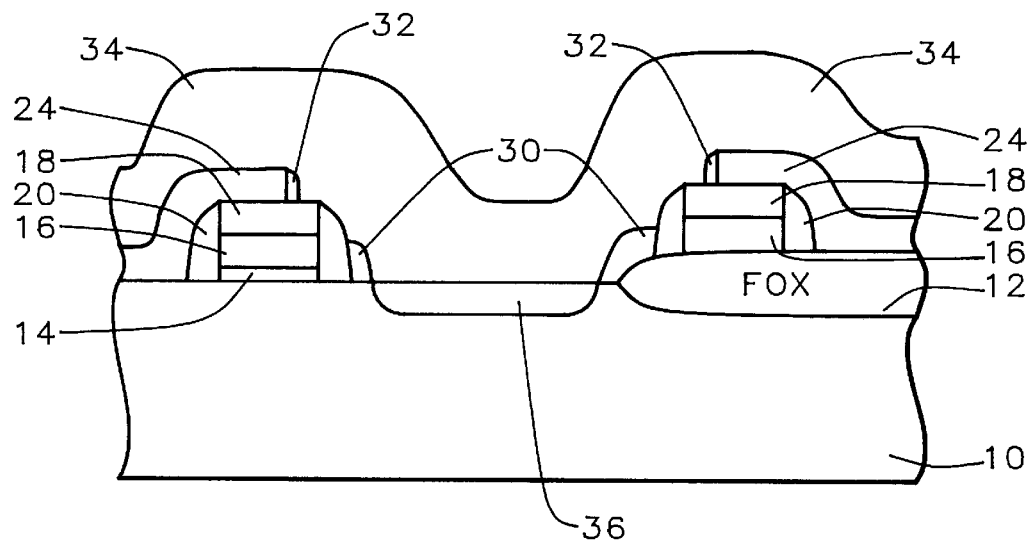
Figure 6B:
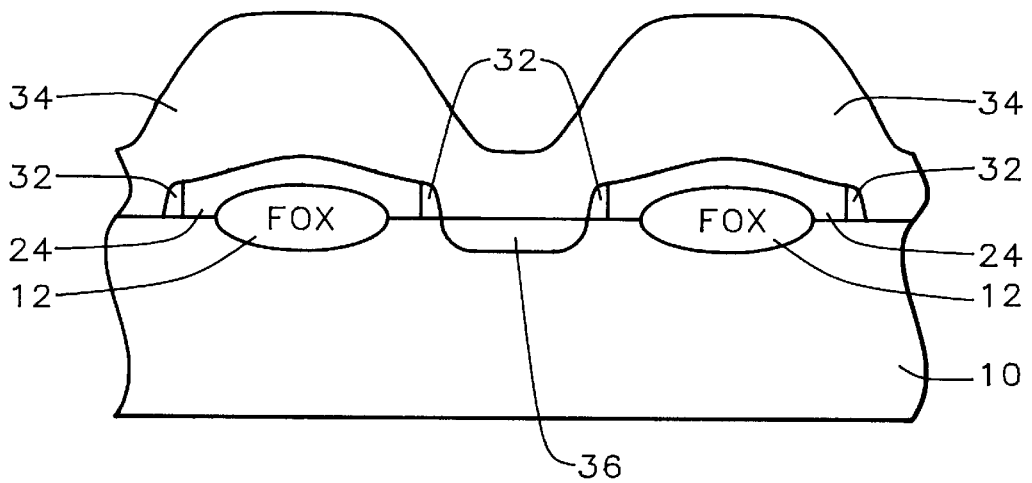

Now the capacitor electrode will be formed. As shown in FIGS. 6A and 6B, a second layer of polysilicon 34 is deposited by low pressure chemical vapor deposition (LPCVD) to a thickness of between about 2000 to 3500 Angstroms. The buried contact will be formed either by diffusion or by ion implanting the polysilicon layer 34. For diffusion, a $POCl_3$ process is used at a high temperature of between about 850° to 950° C. For ion implantation, phosphorus or arsenic ions are implanted to produce N+ regions or boron or $BF_2$ ions are implanted to produce P+ regions. Preferred dosages are in the range of between about 1 E 15 to 5 E 16 atoms/$cm^3$. Alternatively, the polysilicon layer 34 could be in-situ doped.

The dopants are driven into the silicon substrate at a temperature of between about 850° to 950° C. to form buried junction 36. This is done as part of the $POCl_3$ process or during post-etching annealing.

Figure 7A:
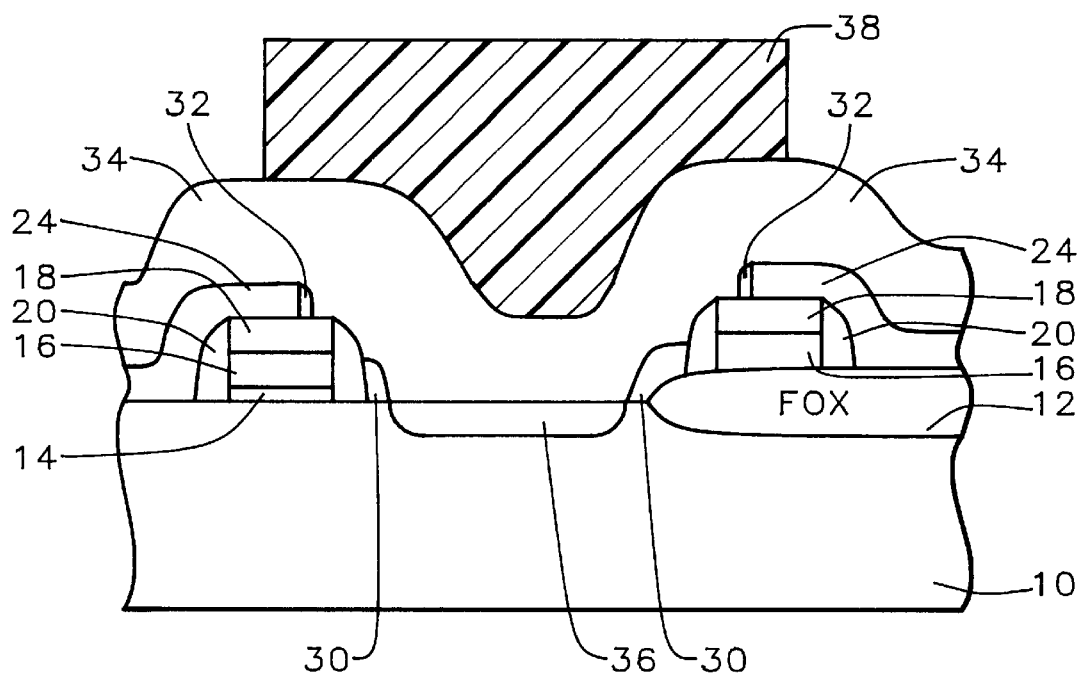
Figure 7B:
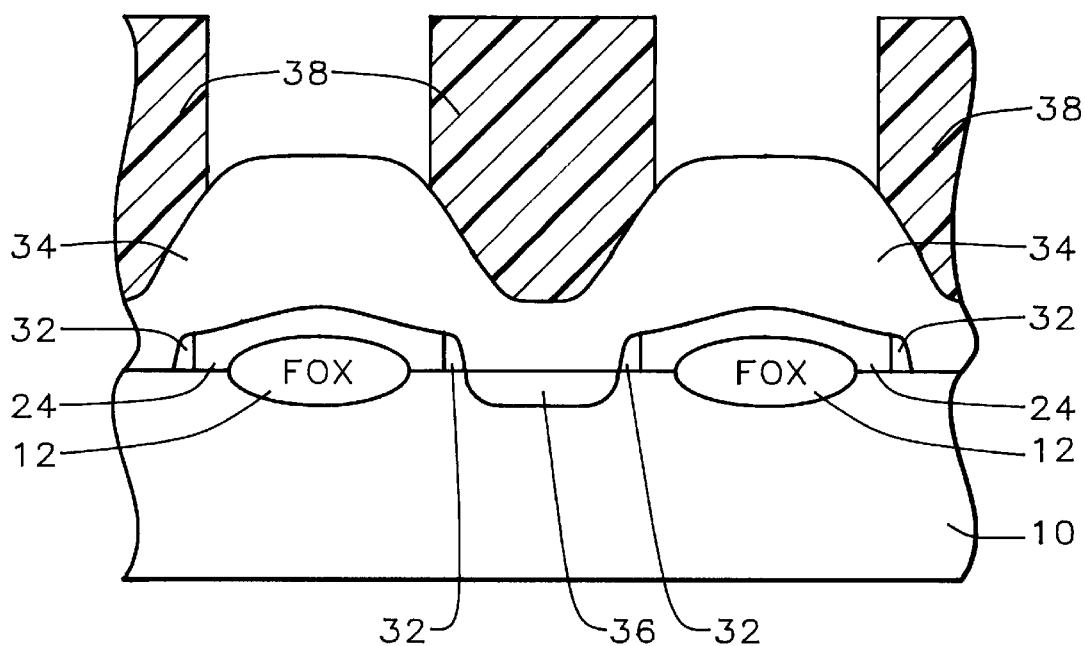

A photoresist mask 38 is formed over the polysilicon layer 34, as shown in FIGS. 7A and 7B. As can be seen with reference to FIG. 7B, if the photoresist mask 38 were misaligned and shifted slightly to either side, without the spacers 32, a trench would be etched into the substrate at the locations of the spacers 32 not covered by the misaligned mask. The presence of the spacers 32 prevents the etching of a trench if the mask is misaligned. The uncovered spacer 32 would be etched into rather than the substrate. Since the spacer etches more slowly than does the substrate, the substrate would be protected by the presence of the spacer.

Figure 8A:
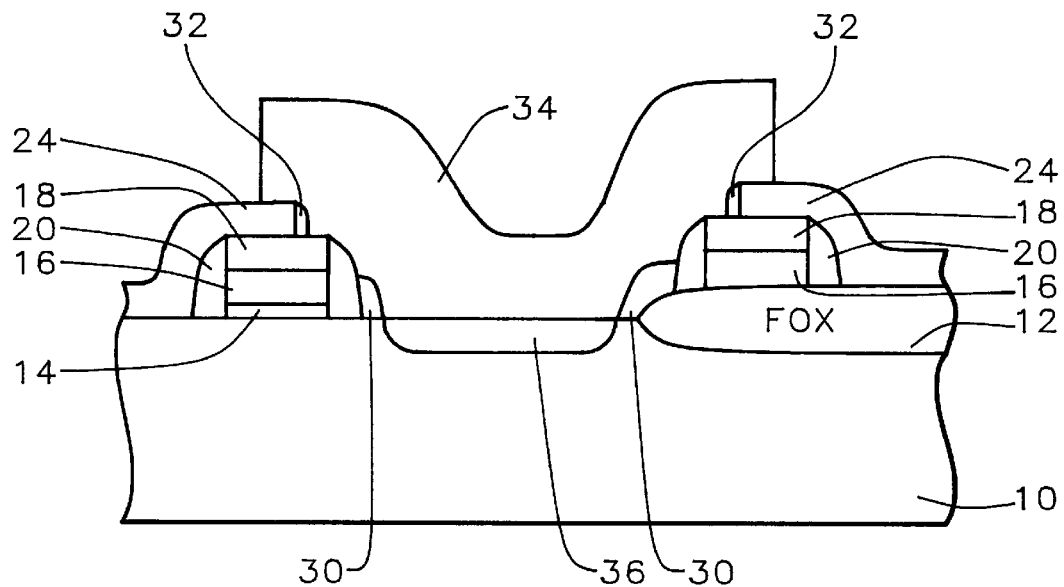
Figure 8B:
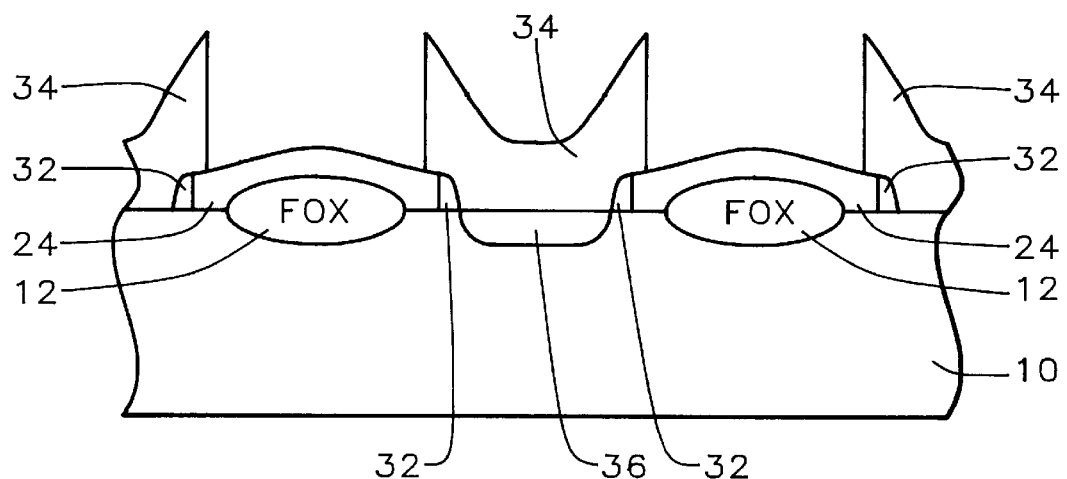

The polysilicon layer 34 is etched away where it is not covered by the mask to form the capacitor electrode, as illustrated in FIGS. 8A and 8B.

Figure 9A:
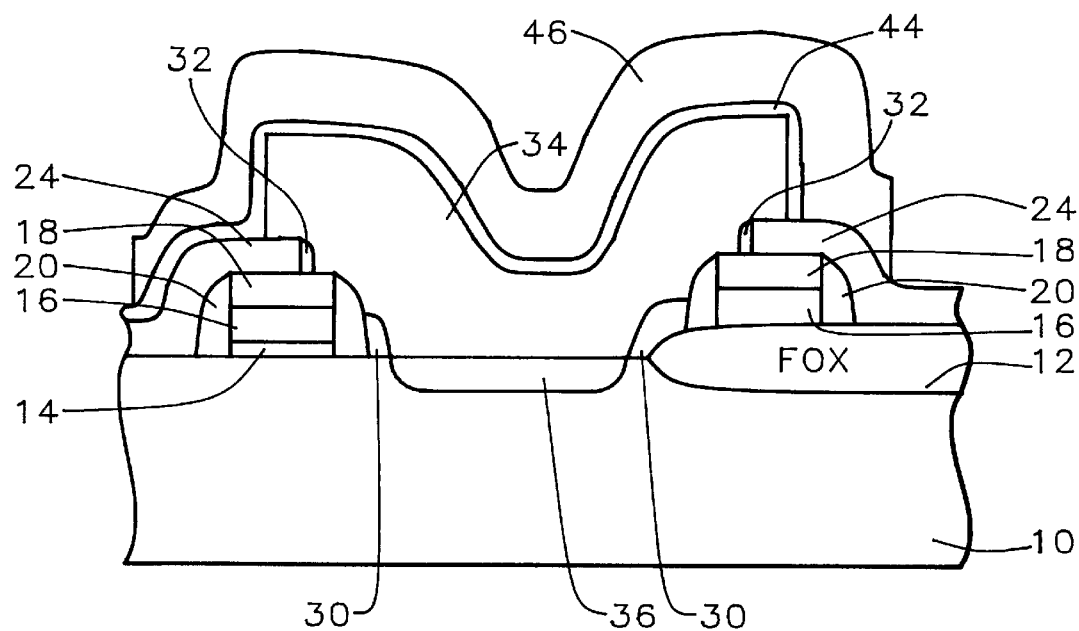
Figure 9B:
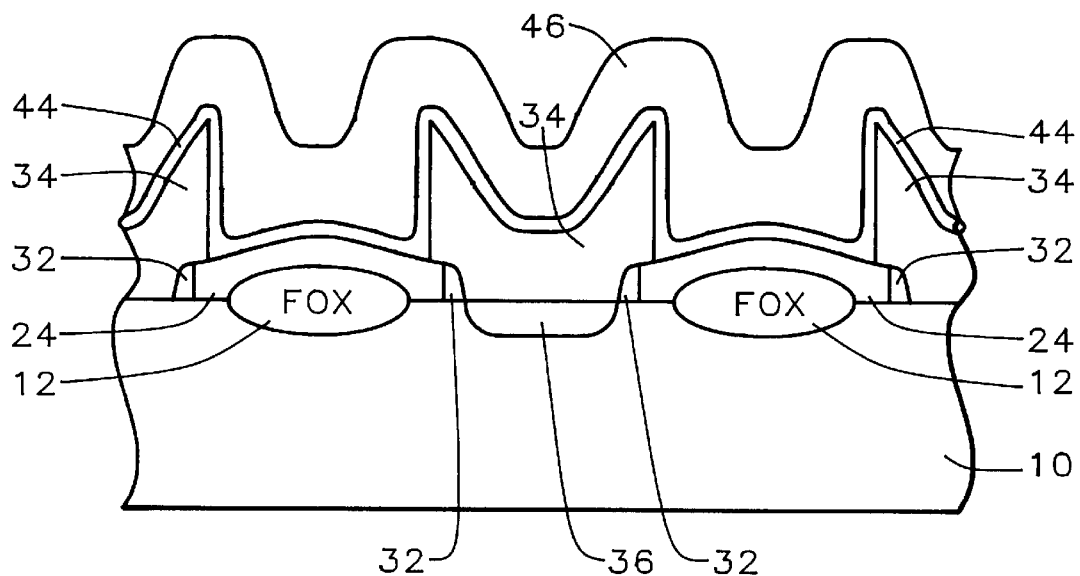

Referring now to FIGS. 9A and 9B, the capacitor dielectric layer 44 is now formed over the surfaces of the capacitor plate 34 and the substrate. The layer is typically composed of either layers of silicon nitride and silicon oxide (NO) or layers of silicon oxide, silicon nitride and silicon oxide (ONO). The total NO or ONO thickness is in the order of 10 to 100 Angstroms.

The top plate electrode is formed by depositing a third polysilicon layer 46 by LPCVD, doped in situ or doped after deposition or by ion implantation. The thickness of this layer 46 is between about 500 to 1500 Angstroms.

Figure 10:
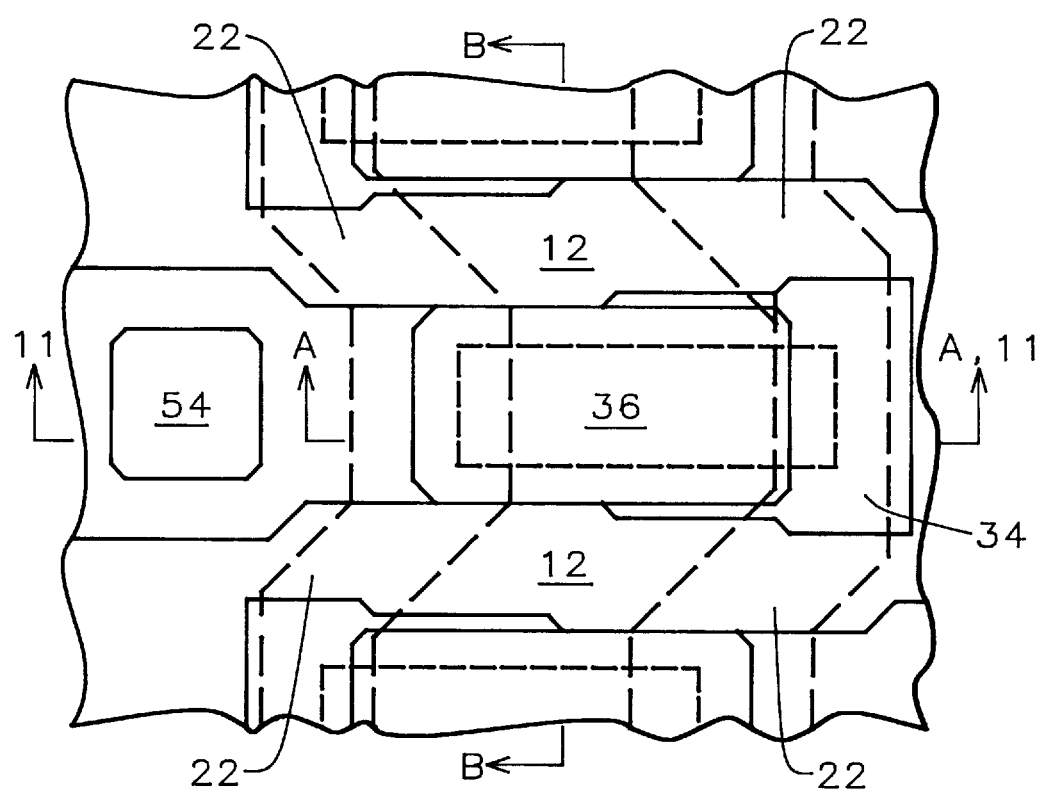
FIG. 10 schematically illustrates a top view of a preferred embodiment of the process of the present invention.

FIG. 10 is a top plan view of the integrated circuit illustrated in FIGS. 1A through 9A and 1B through 9B. The opening to the buried contact region 36 is illustrated in the center of the figure. Word lines 22 are shown flanking the buried contact region 36. The polysilicon cap node 34 is illustrated. Bit line contact 54 is illustrated to the right of the figure.

Figure 11:
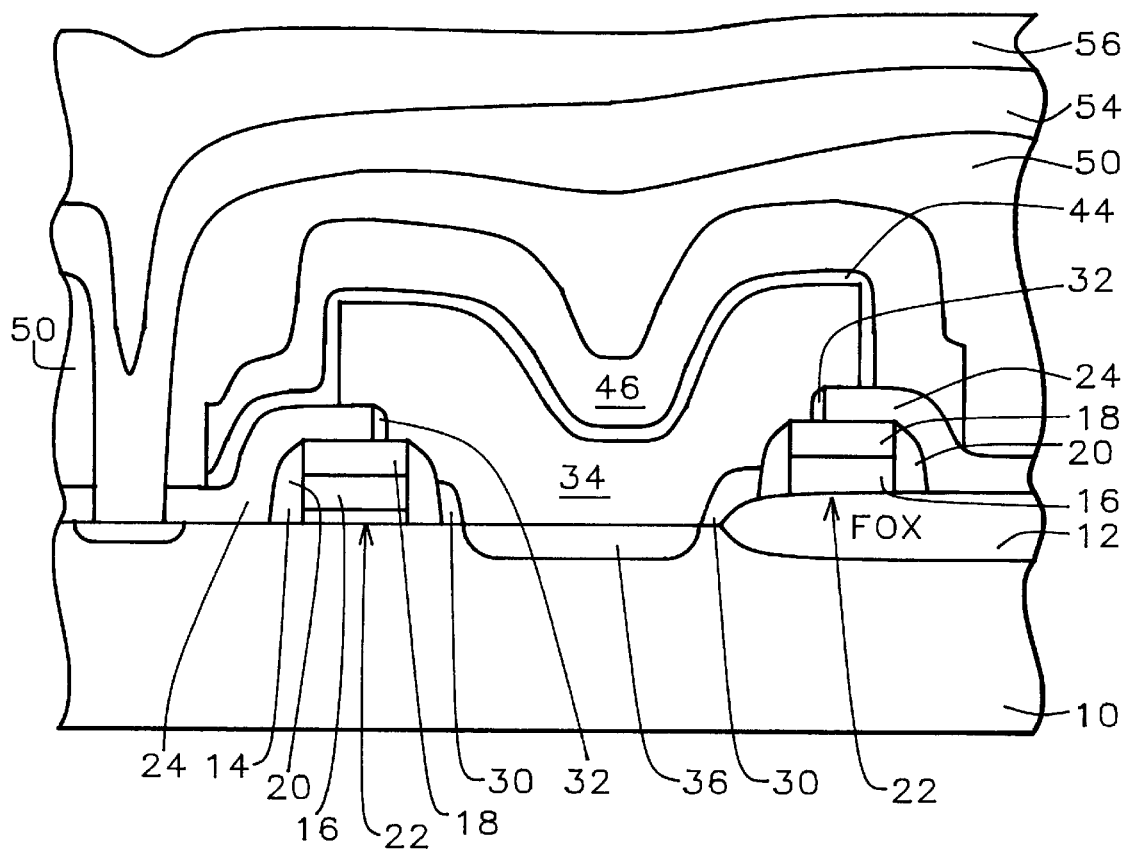
FIG. 11 schematically illustrates in cross-sectional representation a preferred embodiment of this invention for a dynamic random access memory (DRAM).

FIG. 11 illustrates a cross-sectional view of the integrated circuit DRAM device with electrical connections and corresponds to view 11—11 of FIG. 10. A thick insulating layer 50 has been deposited overlying the capacitor structure. A contact opening has been made to lightly doped region 52. Polycide layer 54 is deposited and patterned to form a bit line contact. An insulating layer 56 completes the integrated circuit device.

The process of the invention avoids the etching of a trench into the buried contact junction because of the protective TEOS silicon oxide sidewall spacers. These spacers also reduce the effective buried contact opening which minimizes lateral diffusion of the buried contact.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact in a semiconductor substrate in the fabrication of an integrated circuit comprising:

providing word lines over the surface of said semiconductor substrate;

depositing a first insulating layer overlying said word lines;

etching away said first insulating layer where it is not covered by a buried contact mask to provide an opening to said semiconductor substrate;

depositing a dielectric layer over said first insulating layer and over said semiconductor substrate within said opening;

anisotropically etching said dielectric layer to leave dielectric spacers on the sidewalls of said word lines and on the sidewalls of said first insulating layer;

depositing a first layer of polysilicon overlying said first insulating layer and over said substrate within said opening;

doping said first polysilicon layer with dopant;

driving in said dopant to form a buried contact junction within said semiconductor substrate under said opening;

patterning said first polysilicon layer to form a polysilicon contact overlying said buried contact junction wherein a portion of said first polysilicon layer other than that of the contact remains as residue; and etching away said first polysilicon layer residue completing the formation of said buried contact in the fabrication of an integrated circuit.

2. The method according to claim 1 wherein said first insulating layer has a thickness of between about 1000 to 2000 Angstroms.

3. The method according to claim 1 wherein said dielectric layer comprises tetraethoxysilane (TEOS) silicon oxide having a thickness of between about 1000 to 2000 Angstroms.

4. The method according to claim 1 wherein said dielectric layer comprises silicon nitride having a thickness of between about 1000 to 2000 Angstroms.

5. The method according to claim 1 wherein said dielectric spacers have a width of between about 1000 to 2000 Angstroms.

6. The method according to claim 1 wherein said first polysilicon layer is doped by diffusion of $POCl_3$.

7. The method according to claim 1 wherein said first polysilicon layer is doped by ion implant of phosphorus ions with a dosage of between about 1 E 15 to 5 E 16 atoms/$cm^3$.

8. The method according to claim 1 wherein said first polysilicon layer is doped by ion implant of arsenic ions with a dosage of between about 1 E 15 to 5 E 16 atoms/$cm^3$.

9. The method according to claim 1 wherein said first polysilicon layer is doped by ion implant of boron ions with a dosage of between about 1 E 15 to 5 E 16 atoms/$cm^3$.

10. The method according to claim 1 wherein said first polysilicon layer is doped by ion implant of $BF_2$ ions with a dosage of between about 1 E 15 to 5 E 16 atoms/$cm^3$.

11. The method according to claim 1 wherein said drive-in of said buried contact is performed at between about 850° to 950° C.

12. The method according to claim 1 wherein said patterned first polysilicon layer forms a capacitor electrode and further comprising the steps of:

depositing a capacitor dielectric layer overlying said patterned first polysilicon layer;

depositing a second polysilicon layer overlying said capacitor dielectric layer; and patterning said second polysilicon layer to form a capacitor top plate.

13. A method of forming a buried contact in a semiconductor substrate in the fabrication of an integrated circuit comprising:

providing word lines over the surface of said semiconductor substrate;

depositing a first insulating layer overlying said word lines;

etching away said first insulating layer where it is not covered by a buried contact mask to provide an opening to said semiconductor substrate;

depositing a dielectric layer over said first insulating layer and over said semiconductor substrate within said opening;

anisotropically etching said dielectric layer to leave dielectric spacers on the sidewalls of said word lines and on the sidewalls of said first insulating layer;

depositing a first layer of polysilicon overlying said first insulating layer and over said substrate within said opening;

doping said first polysilicon layer with dopant;

driving in said dopant to form a buried contact junction within said semiconductor substrate under said opening;

patterning said first polysilicon layer to form a polysilicon contact overlying said buried contact junction wherein the mask used for said patterning is misaligned and wherein a portion of a dielectric spacer overlying said buried contact junction is exposed and wherein a portion of said first polysilicon layer other than that of the contact remains as residue; and etching away said first polysilicon layer residue wherein said exposed dielectric spacer protects said buried contact junction within said semiconductor substrate from said etching completing the formation of said buried contact in the fabrication of an integrated circuit.

14. The method according to claim 13 wherein said first insulating layer has a thickness of between about 1000 to 2000 Angstroms.

15. The method according to claim 13 wherein said dielectric layer comprises tetraethoxysilane (TEOS) silicon oxide having a thickness of between about 1000 to 2000 Angstroms.

16. The method according to claim 13 wherein said dielectric layer comprises silicon nitride having a thickness of between about 1000 to 2000 Angstroms.

17. The method according to claim 13 wherein said dielectric spacers have a width of between about 1000 to 2000 Angstroms.

18. The method according to claim 13 wherein said patterned first polysilicon layer forms a capacitor electrode and further comprising the steps of:

depositing a capacitor dielectric layer overlying said patterned first polysilicon layer;

depositing a second polysilicon layer overlying said capacitor dielectric layer; and patterning said second polysilicon layer to form a capacitor top plate.

19. A method of forming a buried contact in a semiconductor substrate in the fabrication of a dynamic random access memory (DRAM) integrated circuit comprising:

providing word lines over the surface of said semiconductor substrate;

depositing a first insulating layer overlying said word lines;

etching away said first insulating layer where it is not covered by a buried contact mask to provide an opening to said semiconductor substrate;

depositing a dielectric layer over said first insulating layer and over said semiconductor substrate within said opening;

anisotropically etching said dielectric layer to leave dielectric spacers on the sidewalls of said word lines and on the sidewalls of said first insulating layer;

depositing a first layer of polysilicon overlying said first insulating layer and over said substrate within said opening;

doping said first polysilicon layer with dopant;

driving in said dopant to form a buried contact junction within said semiconductor substrate under said opening;

patterning said first polysilicon layer to form a polysilicon contact overlying said buried contact junction wherein said patterning also forms a capacitor electrode and wherein the mask used for said patterning is misaligned and wherein a portion of a dielectric spacer overlying said buried contact junction is exposed and wherein a portion of said first polysilicon layer other than that of the contact remains as residue;

etching away said first polysilicon layer residue wherein said exposed dielectric spacer protects said buried contact junction within said semiconductor substrate from said etching;

depositing a capacitor dielectric layer overlying said patterned first polysilicon layer;

depositing a second polysilicon layer overlying said capacitor dielectric layer; and patterning said second polysilicon layer to form a capacitor top plate completing the formation of said buried contact in the fabrication of said DRAM integrated circuit.

20. The method according to claim 19 wherein said first insulating layer has a thickness of between about 1000 to 2000 Angstroms.

21. The method according to claim 19 wherein said dielectric layer comprises tetraethoxysilane (TEOS) silicon oxide having a thickness of between about 1000 to 2000 Angstroms.

22. The method according to claim 19 wherein said dielectric layer comprises silicon nitride having a thickness of between about 1000 to 2000 Angstroms.

23. The method according to claim 19 wherein said dielectric spacers have a width of between about 1000 to 2000 Angstroms.

24. The method according to claim 19 wherein said drive-in of said buried contact is performed at between about 850° to 950° C.

* * * * *